(12) United States Patent
Weng

(10) Patent No.: US 10,729,004 B1
(45) Date of Patent: Jul. 28, 2020

(54) CIRCUIT BOARD STRUCTURE FOR PREVENTING HIGH-FREQUENCY SIGNAL LEAKAGE AND A MANUFACTURING METHOD THEREOF

(71) Applicant: FOREWIN FPC (SUZHOU) CO., LTD., Suzhou (CN)

(72) Inventor: Wally Weng, Suzhou (CN)

(73) Assignee: FOREWIN FPC (SUZHOU) CO., LTD., Suzhou (CN)

( * ) Notice: Subject to any disclaimer, the term of this patent is extended or adjusted under 35 U.S.C. 154(b) by 0 days.

(21) Appl. No.: 16/439,700

(22) Filed: Jun. 13, 2019

(30) Foreign Application Priority Data

May 28, 2019 (CN) .......................... 2019 1 0450514

(51) Int. Cl.
*H05K 9/00* (2006.01)
*H05K 1/02* (2006.01)

(52) U.S. Cl.
CPC ......... *H05K 1/0237* (2013.01); *H05K 9/0024* (2013.01); *H05K 9/0084* (2013.01)

(58) Field of Classification Search
CPC .......................................... H05K 9/0024–009
See application file for complete search history.

(56) References Cited

U.S. PATENT DOCUMENTS

| 4,858,075 A * | 8/1989 | Butterworth ........... H05K 3/284 361/739 |
| 5,285,619 A * | 2/1994 | Jones ...................... B65B 53/02 53/431 |
| 5,739,463 A * | 4/1998 | Diaz .................... H05K 5/0039 174/378 |
| 6,768,654 B2 * | 7/2004 | Arnold ............. B29C 45/14811 174/394 |
| 2017/0048968 A1 * | 2/2017 | Komatsu .............. H05K 1/0237 |

* cited by examiner

*Primary Examiner* — Hoa C Nguyen
(74) *Attorney, Agent, or Firm* — Ding Yu Tan

(57) ABSTRACT

A circuit board structure for preventing high-frequency signal leakage and a manufacturing method thereof are provided, in which the circuit board structure body includes a signal layer, a first ground layer, and a second ground layer. A first shielding film structure and a second shielding film structure are respectively covered on the upper surface and the lower surface of the circuit board structure body and are aligned and adhered, so that the upper surface, the lower surface and the entire board edge of the circuit board structure body are wrapped by the first shielding film structure and the second shielding film structure. The first shielding film structure includes a first conductive metal layer and a first insulating layer, and the second shielding film structure includes a second conductive metal layer and a second insulating layer.

5 Claims, 4 Drawing Sheets

CIRCUIT BOARD STRUCTURE FOR PREVENTING HIGH-FREQUENCY SIGNAL LEAKAGE AND A MANUFACTURING METHOD THEREOF

FIELD OF THE INVENTION

The present invention relates to a technical field of electronic circuit boards, and more particularly to a circuit board structure for preventing high-frequency signal leakage and a manufacturing method thereof.

BACKGROUND OF THE INVENTION

The description of this section merely provides background information related to the present invention and does not constitute prior art.

With the development of 5G technology, more and more electronic products have flooded into the market. One of the important problems in current electronic products is signal leakage. Signal leakage may cause cross-region coverage, which may also cause adjacent-frequency interference. This also increases the shielding level requirements for high-frequency signals of electronic products, thereby requiring electronic products to effectively reduce signal leakage problems.

It should be noted that the above description of the technical background is merely for the purpose of facilitating a clear and complete description of technical solutions of the present invention, and is convenient for understanding by those skilled in the art. The above technical solutions should not be considered to be well-known to those skilled in the art, simply because these aspects are set forth in background section of the present invention.

SUMMARY OF THE INVENTION

In order to solve the above problems, it is an object of the present invention to provide a circuit board structure for preventing high-frequency signal leakage and a manufacturing method thereof, which can effectively reduce the high-frequency signal leakage problem of circuit board structures, and can make related electronic products safely use and transmit at high speed.

According to an exemplary embodiment, a circuit board structure for preventing high-frequency signal leakage is provided. The circuit board structure includes a circuit board structure body, a first shielding film structure, and a second shielding film structure. The circuit board structure body includes a signal layer configured to generate high-frequency signals, a first ground layer laminated on a first side of the signal layer, and a second ground layer laminated on a second side of the signal layer. The first shielding film structure includes a first conductive metal layer and a first insulating layer laminated on one side of the first conductive metal layer. The second shielding film structure includes a second conductive metal layer and a second insulating layer laminated on one side of the second conductive metal layer. The first shielding film structure and the second shielding film structure are respectively covered on an upper surface and a lower surface of the circuit board structure body and are aligned and adhered, so that the upper surface, the lower surface and an entire board edge of the circuit board structure body are wrapped by the first shielding film structure and the second shielding film structure.

In one embodiment, the circuit board structure body further includes a first liquid crystal polyester film and a second liquid crystal polyester film. The first liquid crystal polyester film is laminated between the signal layer and the first ground layer, and the second liquid crystal polyester film is laminated between the signal layer and the second ground layer.

In one embodiment, the circuit board structure body further includes a first cover film and a second cover film. The first cover film is laminated on an outer surface of the first ground layer, and the second cover film is laminated on an outer surface of the second ground layer.

In one embodiment, the first conductive metal layer of the first shielding film structure is coated with glue and is adhered to the upper surface of the circuit board structure body, and the second conductive metal layer of the second shielding film structure is coated with glue and is adhered to the lower surface of the circuit board structure body.

In one embodiment, the circuit board structure body is a Flexible Printed Circuit (FPC).

According to another exemplary embodiment, a method of manufacturing a circuit board structure for preventing high-frequency signal leakage is provided. The method includes the following steps: preparing a circuit board structure body, including the following sub-steps: disposing a signal layer for generating high-frequency signals, laminating a first ground layer on a first side of the signal layer, and laminating a second ground layer on a second side of the signal layer; preliminarily cutting a profile of the circuit board structure body by laser; respectively covering a first shielding film structure and a second shielding film structure on an upper surface and a lower surface of the circuit board structure body, and aligning and adhering them, wherein the first shielding film structure comprises a first conductive metal layer and a first insulating layer laminated on one side of the first conductive metal layer, and the second shielding film structure comprises a second conductive metal layer and a second insulating layer laminated on one side of the second conductive metal layer; and pressing the circuit board structure body after adhering, so that the upper surface, the lower surface and an entire board edge of the circuit board structure body are wrapped by the first shielding film structure and the second shielding film structure.

In one embodiment, the method further includes the following steps: performing a surplus cutting on the circuit board structure body, so that a distance between the first/second shielding film structure and the profile of the circuit board structure body is less than 150 um.

In one embodiment, the step of "preparing a circuit board structure body" further includes the following sub-steps: laminating a first liquid crystal polyester film between the signal layer and the first ground layer; and laminating a second liquid crystal polyester film between the signal layer and the second ground layer.

In one embodiment, the step of "preparing a circuit board structure body" further includes the following sub-steps: laminating a first cover film on an outer surface of the first ground layer; and laminating a second cover film on an outer surface of the second ground layer.

In one embodiment, the step of "respectively covering a first shielding film structure and a second shielding film structure on an upper surface and a lower surface of the circuit board structure body, and aligning and adhering them" further includes the following sub-steps: coating the first conductive metal layer of the first shielding film structure with glue, and adhering it to the upper surface of the circuit board structure body; and coating the second conductive metal layer of the second shielding film structure with glue, and adhering it to the lower surface of the circuit board structure body.

With the above technical solution, the present invention includes the following advantages. For a liquid crystal polymer material having a better transmission effect, it is easy to cause high-frequency signal leakage when it's used for transmission. By wrapping shielding film structures on the upper surface, the lower surface, and the entire board edge of the circuit board structure, the high-frequency signal leakage problem of the circuit board structure can be effectively reduced. Related electronic products can be prevented from mutual interference, which is benefit for high-speed transmission and safe use.

BRIEF DESCRIPTION OF THE DRAWINGS

Aspects of the present invention are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE PREFERRED EMBODIMENTS

Figure 1:
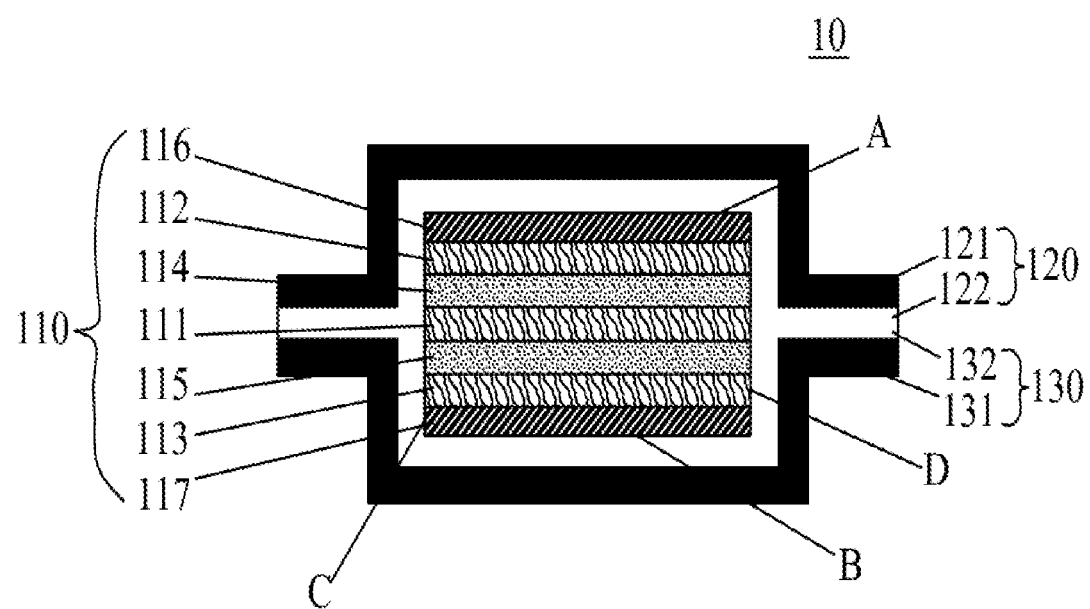
FIG. 1 is a structural diagram of a circuit board structure for preventing high-frequency signal leakage according to an embodiment of the present invention.

The following invention provides many different embodiments, or examples, for implementing different features of the provided subject matter. Specific examples of components and arrangements are described below to simplify the present invention. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present invention may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2A:
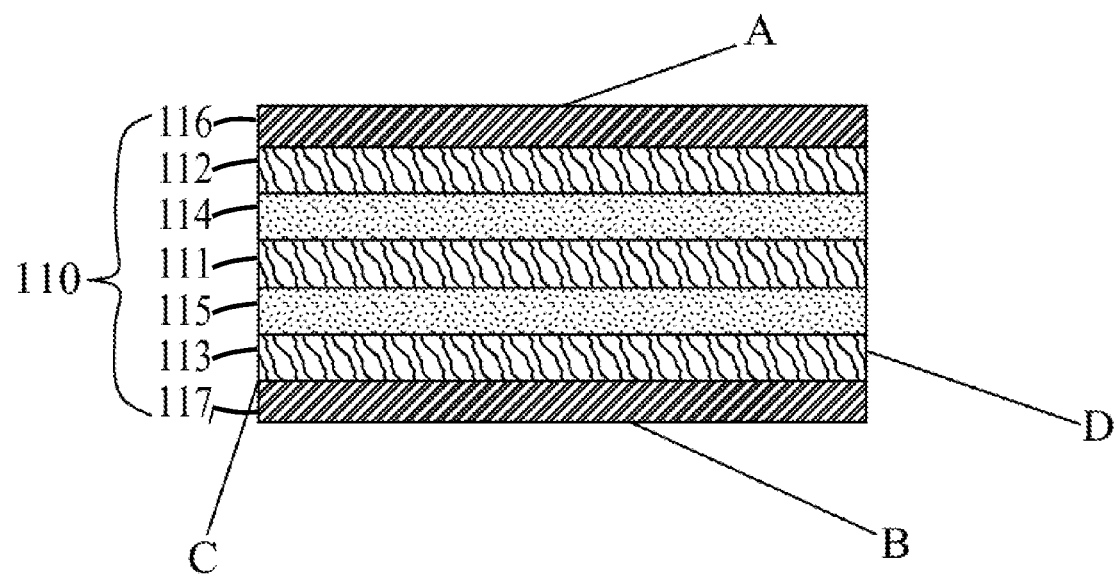
FIG. 2A is a structural (cross-sectional view) diagram of a circuit board structure body shown in FIG. 1.
Figure 2B:
FIG. 2B is a structural (cross-sectional view) diagram of a first shielding film structure and a second shielding film structure shown in FIG. 1.

Please refer to FIG. 1, FIG. 2A, and FIG. 2B. FIG. 1 is a structural (cross-sectional view) diagram of a circuit board structure 10 for preventing high-frequency signal leakage according to an embodiment of the present invention, FIG. 2A is a structural (cross-sectional) diagram of a circuit board structure body 110 shown in FIG. 1, and FIG. 2B is a structural (cross-sectional view) diagram of a first shielding film structure 120 or a second shielding film structure 130 shown in FIG. 1, respectively. As shown in FIG. 1, the circuit board structure 10 for preventing high-frequency signal leakage according to the embodiment may include, but is not limited to, a circuit board structure body 110, a first shielding film structure 120, and a second shielding film structure 130.

The circuit board structure body 110 includes a signal layer 111 configured to generate high-frequency signals, a first ground layer 112 laminated on a first side of the signal layer 111, and a second ground layer 113 laminated on a second side of the signal layer 111. In this embodiment, the first side refers to the upper side of the circuit board structure body 110, and the second side refers to the lower side of the circuit board structure body 110, but this is merely an example, and should not be a limitation of the present invention.

As shown in FIG. 1 and FIG. 2B, the first shielding film structure 120 includes a first conductive metal layer 122 and a first insulating layer 121 laminated on one side of the first conductive metal layer 122. The second shielding film structure 130 includes a second conductive metal layer 132 and a second insulating layer 131 laminated on one side of the second conductive metal layer 132. The first shielding film structure 120 and the second shielding film structure 130 are respectively covered on an upper surface A and a lower surface B of the circuit board structure body 110 and are aligned and adhered, so that the upper surface A, the lower surface B and an entire board edge of the circuit board structure body 110 are wrapped by the first shielding film structure 120 and the second shielding film structure 130.

As shown in FIG. 1 and FIG. 2A, in another implementation manner, the circuit board structure body 110 may further include a first liquid crystal polyester film 114 laminated between the signal layer 111 and the first ground layer 112, and a second liquid crystal polyester film 115 laminated between the signal layer 111 and the second ground layer 113. The first liquid crystal polyester film 114 and the second liquid crystal polyester film 115 may be made of a liquid crystal polymer material (LCP).

As shown in FIG. 1 and FIG. 2A, in another implementation manner, the circuit board structure body 110 may further include a first cover film 116 laminated on an outer surface of the first ground layer 112, and a second cover film 117 laminated on an outer surface of the second ground layer 113.

In one implementation manner, the circuit board structure body 110 may be a flexible printed circuit (FPC), and its material may be liquid crystal polymer (LCP), polyimide (PI), modified polyimide (MPI), or Polytetrafluoroethylene (PTFE). However, this is merely an example and should not be a limitation of the present invention.

It should be noted that, the stack up of the above-mentioned circuit board structure body 110 uses a seven-layer structure (including the signal layer 111, the first ground layer 112, the second ground layer 113, the first liquid crystal polyester film 114, the second liquid crystal polyester film 115, the first cover film 116, and the second cover film 117) as an example, but this is merely used to help understand the core idea of the present invention, and should not be limitations of the present invention. The layer number, thickness and material of the stack up of the circuit board structure body 110 may be designed according to actual requirements.

It should be noted that, when the adhering process is performed, the first conductive metal layer 122 of the first shielding film structure 120 is coated with glue, and then the first conductive metal layer 122 is adhered to the upper surface A of the circuit board structure body 110; the second conductive metal layer 132 of the second shielding film structure 130 is coated with glue, and then the second conductive metal layer 132 is adhered to the lower surface B of the circuit board structure body 110.

Figure 3:
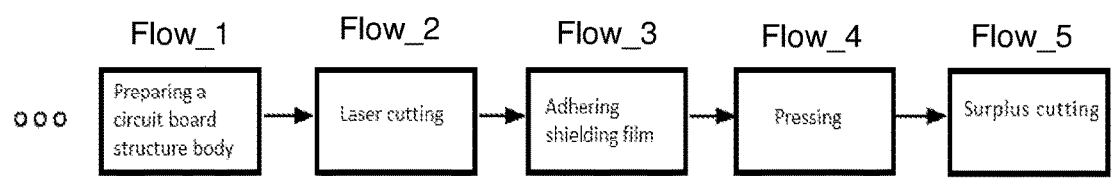
FIG. 3 is a process flow chart of a method of manufacturing a circuit board structure for preventing high-frequency signal leakage according to an embodiment of the present invention.
Figure 3:
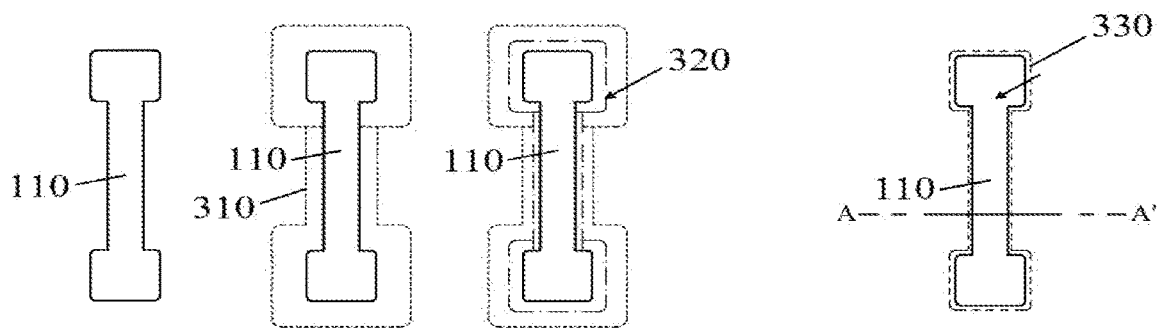

Please refer to FIG. 3. FIG. 3 is a process flow chart of a method of manufacturing a circuit board structure for preventing high-frequency signal leakage according to an embodiment of the present invention. The process flow chart includes the following process steps.

First, a first process step (labelled as Flow_1 in FIG. 3) of preparing a circuit board structure body is performed, including the following sub-steps: disposing a signal layer 111 for generating high-frequency signals, laminating a first ground layer 112 on a first side of the signal layer 111, and laminating a second ground layer 113 on a second side of the signal layer 111.

Then, a second process step (labelled as Flow_2 in FIG. 3) of laser cutting is performed, wherein a profile of the circuit board structure body 110 is preliminarily cut by laser. As shown in the second process step (refer to Flow_2) of FIG. 3, the middle part refers to the circuit board structure body 110, and the laser cutting is performed along a dotted line 310 around the periphery of the circuit board structure body 110.

Next, a third process step (labelled as Flow_3 in FIG. 3) of adhering shielding film structures is performed. A first shielding film structure 120 and a second shielding film structure 130 are covered on an upper surface A and a lower surface B of the circuit board structure body 110, respectively, and are aligned and adhered. In one example, after the first shielding film structure 120 and the second shielding film structure 130 are respectively covered on the upper surface A and the lower surface B of the circuit board structure body 110, an alignment fixture can be used for aligning them, as shown by a dotted line 320 in the third process step labelled Flow_3 in FIG. 3. Be noted that, when the adhering process is performed, the first shielding film structure 120 is coated with glue and is adhered to the upper surface A of the circuit board structure body 110, and the second shielding film structure 130 is coated with glue and is adhered to the lower surface B of the circuit board structure body 110.

Next, a fourth process step (labelled as Flow_4 in FIG. 3) of pressing the circuit board structure body 110 is performed. The circuit board structure body 110 after adhering is pressed, so that the upper surface A, the lower surface B, and the entire board edge (such as, side walls C and D as shown in FIG. 1) of the circuit board structure body 110 are wrapped by the first shielding film structure 120 and the second shielding film structure 130.

In another implementation manner, the process flow chart of a method of manufacturing a circuit board structure for preventing high-frequency signal leakage may further includes the following process steps.

A fifth process step labelled Flow_5 of surplus cutting is performed. A surplus cutting is performed on the circuit board structure body 110, so that a distance between the first/second shielding film structure 120/130 and the profile of the circuit board structure body 110 is less than 150 μm. As shown in the process step labelled Flow_5 of FIG. 3, a cutting is performed along the dotted line 330 to trim a surplus portion of the first shielding film structure 120 and the second shielding film structure 130, which can ensure that the thickness of the first shielding film structure 120 and the second shielding film structure 130 is between 10 μm and 150 μm. The main purpose for the fifth process step is to trim the surplus portion of the shielding film material, which ensures that the first shielding film structure 120 and the second shielding film structure 130 are not delaminated. At this time, FIG. 1 refers to a cross-sectional view in which the circuit board structure 10 after performing the surplus cutting is vertically cut along the AA' direction. It can be seen that, not only can the upper surface A and the lower surface B of the circuit board structure body 110 be respectively wrapped by the first shielding film structure 120 and the second shielding film structure 130, but also the entire board edge (including the side walls C and D) is wrapped by the first shielding film structure 120 and the second shielding film structure 130. Therefore, the high-frequency signal leakage problem of the circuit board structure can be effectively reduced. Related electronic products can be prevented from mutual interference, which is beneficial for higher-speed transmission and safer usage.

Figure 4:
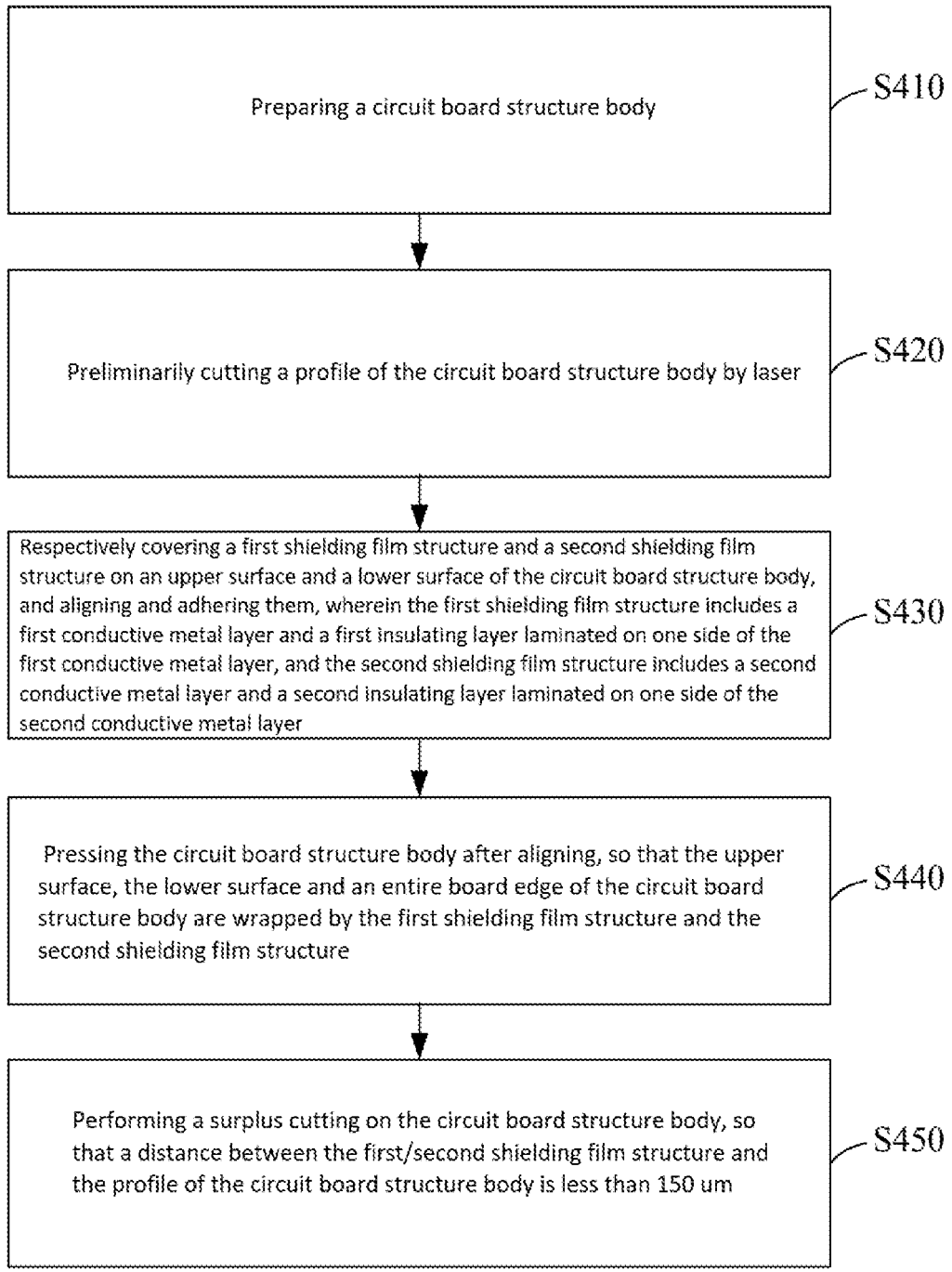
FIG. 4 is a flow chart showing a method of manufacturing a circuit board structure for preventing high-frequency signal leakage according to an embodiment of the present invention.

Please refer to FIG. 4. FIG. 4 is a flow chart showing a method of manufacturing a circuit board structure for preventing high-frequency signal leakage according to an embodiment of the present invention. The method includes the following steps.

Step S410: Preparing a circuit board structure body.

Step S420: Preliminarily cutting a profile of the circuit board structure body by laser.

Step S430: Respectively covering a first shielding film structure and a second shielding film structure on an upper surface and a lower surface of the circuit board structure body, and aligning and adhering them, wherein the first shielding film structure includes a first conductive metal layer and a first insulating layer laminated on one side of the first conductive metal layer, and the second shielding film structure includes a second conductive metal layer and a second insulating layer laminated on one side of the second conductive metal layer.

Step S440: Pressing the circuit board structure body after adhering, so that the upper surface, the lower surface and an entire board edge of the circuit board structure body are wrapped by the first shielding film structure and the second shielding film structure.

Step S450: Performing a surplus cutting on the circuit board structure body, so that a distance between the first/second shielding film structure and the profile of the circuit board structure body is less than 150 μm.

Be noted that, in one implementation manner, the step S410 may further include the following sub-steps.

Sub-step S411: Disposing a signal layer for generating high-frequency signals, laminating a first ground layer on a first side of the signal layer, and laminating a second ground layer on a second side of the signal layer.

Sub-step S412: Laminating a first liquid crystal polyester film between the signal layer and the first ground layer; and laminating a second liquid crystal polyester film between the signal layer and the second ground layer.

Sub-step S413: Laminating a first cover film on an outer surface of the first ground layer; and laminating a second cover film on an outer surface of the second ground layer.

Be noted that, in one implementation manner, the step S430 may further include the following sub-steps.

Sub-step S431: Coating the first conductive metal layer of the first shielding film structure with glue, and adhering it to the upper surface of the circuit board structure body.

Sub-step S432: Coating the second conductive metal layer of the second shielding film structure with glue, and adhering it to the lower surface of the circuit board structure body.

As shown in FIG. 1 and FIG. 4, a circuit board structure for preventing high-frequency signal leakage and a manufacturing method thereof are disclosed in the embodiments of the present invention. The circuit board structure body 110 includes the signal layer 111 for generating high-frequency signals, and the first ground layer 112 and the second ground layer 113 laminated on two sides of the signal layer 111. The signal layer 111 is made of a liquid crystal polymer material (LCP). For a liquid crystal polymer material (LCP) having a better transmission effect, it is easy to cause high-frequency signal leakage as a transmission layer. By wrapping the entire circuit board structure body 110 (including the upper surface A, the lower surface B, and the side walls C and D) with a shielding material (such as, the first shielding film structure 120 and the second shielding film structure 130), the high-frequency signal leakage problem of the circuit board structure 10 can be effectively reduced. Related electronic products can be prevented from mutual interference, which is beneficial for high-speed transmission and safe use.

The foregoing outlines features of several embodiments so that those skilled in the art may better understand the aspects of the present invention. Those skilled in the art should appreciate that they may readily use the present invention as a basis for designing or modifying other processes and structures for carrying out the same purposes and/or achieving the same advantages of the embodiments introduced herein. Those skilled in the art should also realize that such equivalent constructions do not depart from the spirit and scope of the present invention, and that they may make various changes, substitutions, and alterations herein without departing from the spirit and scope of the present invention.

What is claimed is:

1. A method of manufacturing a circuit board structure for preventing high-frequency signal leakage, comprising:
    preparing a circuit board structure body, wherein the circuit board structure body includes an upper surface, a lower surface, a left side wall and a right side wall, comprising the following sub-steps:
        disposing a signal layer for generating high-frequency signals, laminating a first ground layer on a first side of the signal layer, and laminating a second ground layer on a second side of the signal layer;
    preliminarily cutting a profile of the circuit board structure body by laser;
    covering a first shielding film structure and a second shielding film structure on an upper surface and a lower surface of the circuit board structure body, respectively, and aligning and adhering the first shielding film structure and the second shielding film structure to the circuit board structure body, wherein the first shielding film structure and the second shielding film structure are aligned and adhered to the circuit board structure body by an alignment fixture, which occupies a layout area larger than the circuit board structure body but smaller than the profile of the circuit board structure, wherein the first shielding film structure comprises a first conductive metal layer and a first insulating layer laminated on one side of the first conductive metal layer, and the second shielding film structure comprises a second conductive metal layer and a second insulating layer laminated on one side of the second conductive metal layer; and
    pressing the circuit board structure body after adhering, so that the upper surface, an upper portion of the left side wall, and an upper portion of the right side wall of the circuit board structure body are wrapped by the first shielding film structure, and the lower surface, a lower portion of the left side wall, and a lower portion of the right side wall of the circuit board structure body are wrapped by the second shielding film structure,
    wherein the preliminary cutting of the profile of the circuit board structure body is followed by covering the first shielding film structure and the second shielding film structure on the upper surface and the lower surface of the circuit board structure body, respectively, and followed by wrapping of the upper surface, the lower surface and an entire board edge of the circuit board structure body by the first shielding film structure and the second shielding film structure, and then followed by the surplus cutting on the circuit board structure body to remove also excess of the first shielding structure and the second shielding film structure.

2. The method of manufacturing the circuit board structure for preventing high-frequency signal leakage in claim 1, further comprising:
    performing a surplus cutting on the circuit board structure body, so that a distance between the first/second shielding film structure and the profile of the circuit board structure body is less than 150 μm.

3. The method of manufacturing the circuit board structure for preventing high-frequency signal leakage in claim 1, wherein the step of preparing the circuit board structure body further comprises the following sub-steps:
    laminating a first liquid crystal polyester film between the signal layer and the first ground layer; and
    laminating a second liquid crystal polyester film between the signal layer and the second ground layer.

4. The method of manufacturing the circuit board structure for preventing high-frequency signal leakage in claim 1, wherein the step of preparing the circuit board structure body further comprises the following sub-steps:
    laminating a first cover film on an outer surface of the first ground layer; and
    laminating a second cover film on an outer surface of the second ground layer.

5. The method of manufacturing the circuit board structure for preventing high-frequency signal leakage in claim 1, wherein the step of covering the first shielding film structure and the second shielding film structure on the upper surface and the lower surface of the circuit board structure body, respectively, and aligning and adhering thereof further comprises the following sub-steps:
    coating the first conductive metal layer of the first shielding film structure with glue, and adhering the first conductive metal layer to the upper surface of the circuit board structure body; and
    coating the second conductive metal layer of the second shielding film structure with glue, and adhering the second conductive metal layer to the lower surface of the circuit board structure body.

* * * * *